United States Patent
Koeth et al.

(10) Patent No.: US 9,397,480 B2
(45) Date of Patent: Jul. 19, 2016

(54) SEMICONDUCTOR LASER AND METHOD FOR PRODUCING A SEMICONDUCTOR LASER COMPRISING A FEEDBACK ELEMENT

(71) Applicant: nanoplus Nanosystems and Technologies GmbH, Gerbrunn (DE)

(72) Inventors: Johannes Koeth, Gerbrunn (DE); Lars Nähle, Obernbreit (DE)

(73) Assignee: NANOPLUS NANOSYSTEMS AND TECHNOLOGIES GMBH, Gerbrunn (DE)

(*) Notice: Subject to any disclaimer, the term of this patent is extended or adjusted under 35 U.S.C. 154(b) by 0 days.

(21) Appl. No.: 14/702,370

(22) Filed: May 1, 2015

(65) Prior Publication Data

US 2015/0318669 A1 Nov. 5, 2015

(30) Foreign Application Priority Data

May 5, 2014 (DE) .......................... 10 2014 106 209
Apr. 27, 2015 (EP) ...................................... 15165212

(51) Int. Cl.

| H01S 5/34 | (2006.01) |
|---|---|
| H01S 5/20 | (2006.01) |
| H01S 5/10 | (2006.01) |
| H01S 5/065 | (2006.01) |
| H01S 5/22 | (2006.01) |
| H01S 5/12 | (2006.01) |

(52) U.S. Cl.
CPC ............... *H01S 5/3402* (2013.01); *H01S 5/065* (2013.01); *H01S 5/10* (2013.01); *H01S 5/1237* (2013.01); *H01S 5/2018* (2013.01); *H01S 5/22* (2013.01); *H01S 5/1231* (2013.01); *H01S 5/2215* (2013.01); *H01S 2301/176* (2013.01)

(58) Field of Classification Search
CPC ....... H01S 5/3402; H01S 5/1237; H01S 5/22; H01S 5/2018; H01S 5/065; H01S 5/10; H01S 5/2215
See application file for complete search history.

(56) References Cited

U.S. PATENT DOCUMENTS

| 5,982,804 A | 11/1999 | Chen et al. |
|---|---|---|
| 2001/0036213 A1 | 11/2001 | Watanabe et al. |
| 2005/0276298 A1 | 12/2005 | Fischer et al. |
| 2006/0056472 A1 | 3/2006 | Ogura |
| 2012/0093187 A1 | 4/2012 | Koeth et al. |
| 2015/0318668 A1* | 11/2015 | Yoshinaga ............ H01S 5/3401 372/45.012 |

FOREIGN PATENT DOCUMENTS

| JP | 62-295480 A | 12/1987 |
|---|---|---|
| JP | 2014-094714 | * 5/2014 |

OTHER PUBLICATIONS

Extended European Search Report for corresponding EP Application No. 15165212 mailed on Sep. 23, 2015.
Canedy et al., "High-power CW performance of 7-stage interbrand cascade lasers," Proceedings of SPIE—International Society for Optical Engineering (Feb. 27, 2014) vol. 9002: 7 pages. XP060035221.
Tiberio et al., "Laterally-coupled distributed feedback laser fabricated with electron beam lithograpy and chemically assisted ion beam etching," Microelectronic Engineering (1995) 27: 67-70. XP022353798.

* cited by examiner

*Primary Examiner* — Dung Nguyen
(74) *Attorney, Agent, or Firm* — Billion & Armitage; Benjamin C. Armitage (57) ABSTRACT

Embodiments relate to a semiconductor laser having a multilayer structure including a ridge and two material removal areas adjacent to the ridge on either side, the multilayer structure being arranged on a substrate and a layer expansion plane being defined by a surface of the substrate, the ridge having at least one active region and at least the active region being spatially limited by passages between the ridge and the material removal areas in one dimension of the layer expansion plane, the active region having a layer structure for forming an interband cascade laser.

14 Claims, 4 Drawing Sheets

SEMICONDUCTOR LASER AND METHOD FOR PRODUCING A SEMICONDUCTOR LASER COMPRISING A FEEDBACK ELEMENT

CROSS REFERENCE TO RELATED APPLICATIONS

This application claims benefit of Application No. 15165212.0, filed on 27 Apr. 2015 in the EP, and also of Application No. 10 2014 106 209.4, filed on 5 May 2014 in Germany, and which applications are incorporated herein by reference. A claim of priority is made.

BACKGROUND

In known semiconductor lasers and their methods of production, multilayer structures made of semi conductor materials, insulator materials and, if applicable, metals are usually formed by means of corresponding precipitation procedures and layer growth methods and are structured by way of commonly known methods, such as lithographic processes or etching techniques. All semiconductor lasers have in common that they have at least one active region in which stimulated emission takes place, thus enabling the function of a laser.

In the formation of the active region, there substantially are two differences in known semiconductor lasers in terms of the spatial expansion of the active region. In semiconductor laser diodes, for example, the active region is usually two-dimensional and exists in the entire area of the multilayer structure, and localization of the laser radiation is achieved by means of elements such as waveguides and/or a ridge, which are arranged above and/or below the active region and have a corresponding spatial structure. Also, it is known in semiconductor lasers of this kind to arrange optical feedback elements above and/or below the active region, which allow mode selection of the laser radiation, and to thus limit the laser radiation emitted by the semiconductor laser to a single laser mode in the ideal case.

Apart from semiconductor lasers of this kind, structures are also known in which a spatial limitation of the active region is necessary or at least appropriate. Said necessity of spatial limitation is usually caused by the problem of current spreading, which causes the pumping current to spread within the active region, thus allowing only a spatially less localized and consequently inefficient generation of laser radiation. To prevent this kind of current spreading within the active region, material is usually removed in semiconductor lasers of this kind in the course of structuring the multilayer structure, said material being removed in a material removal direction, which is generally perpendicular to a surface of a substrate of the semiconductor laser, and at least enough material or enough layers are removed for the active region to also be completely removed at least in areas along the material removal direction, the active region thus becoming spatially limited in one dimension perpendicularly to the layer expansion plane.

In semiconductor lasers of this kind, too, structuring attempts have been made that aimed at arranging an optical feedback element preferably in spatial proximity to the active region and to thus allow optical feedback and resulting mode selection of the laser radiation in the active region. It is known from US 2006/0056472 A1, for example, to provide a so called vertical grating. However, structures of this kind have proved to be disadvantageous in multiple respects. First of all, their production and corresponding production processes are complex. In addition to or precisely because of that, the percent yield of lasers that have the desired specification of being spectrally single-mode is only very low.

Moreover, for unipolar lasers, it is known from US 2005/0276298 A1 to arrange a plurality of laser cavities in a row so as to achieve mode selection via superimposition of the individual spectra. Different arrangements of grating structures can be used in this process.

Furthermore, from U.S. Pat. No. 5,982,804 A, a DFB semiconductor laser is known that has a grating structure formed by a semiconductor material. The top edge of the semiconductor grating structure can be arranged at level with the top edge of the active zone of the laser.

From documents US 2001/0036213 A1 and JP S62-295 480 A, DFB lasers are also known in which a grating structure layer is arranged in the area of the waveguide ridge and in the adjacent material removal areas.

DETAILED DESCRIPTION

Accordingly, it is the object of the present invention to propose a semiconductor laser having an active region comprising a layer structure for forming an interband cascade laser and a method for its production in which and by means of which an interband cascade laser is provided that does not exhibit any current spreading owing to a corresponding spatial limitation of the active region and that allows effective mode selection of the laser and of the laser radiation by means of a corresponding optical feedback element and additionally realizes a highest possible percent yield of spectrally single-mode lasers.

The semiconductor laser according to the invention has a multilayer structure that comprises a ridge and, in addition, two material removal areas adjacent to the ridge at either side, the multilayer structure being arranged on a substrate and a layer expansion plane being defined by a surface of the substrate. The ridge comprises at least one active region having a layer structure for forming an interband cascade laser, the at least one active region being spatially limited by passages between the ridge and the material removal areas in one dimension of the layer expansion plane. It is provided according to the invention that an insulation layer and a superimposed grating structure layer are provided at least in the material removal areas, the insulation layer and the grating structure layer being arranged in the material removal areas in such a manner that the grating structure layer is arranged below, but not more than 100 nm below a bottom edge of the active region. The distance is to be measured perpendicularly to the layer expansion plane and in the growth direction or removal direction and represent the smallest distance between the bottom edge of the active region and the grating structure layer.

Optical coupling between the grating structure layer and the laser light of the active region can be realized particularly effectively if according to the invention the grating structure layer comprises metal, in particular chromium.

By arranging the grating structure layer in this manner, at least an evanescent portion of the wave of the laser radiation, which also extends into areas outside of the active region, is allowed to undergo optical coupling with the grating structure layer, which is realized as a feedback element, thus accommodating in a particularly advantageous manner both the requirements relating to avoiding current spreading by means of the spatial limitation of the active region and the requirements relating to effective mode selection so as to provide a single-mode semiconductor laser.

With respect to the proposed semiconductor lasers and with respect to the described method, the term "bottom" is to designate a side or a direction that, with respect to the substrate of the semiconductor laser, is oriented toward said substrate or faces in the direction of said substrate. In other words, this means that the bottom edge of the active region means the boundary of the active region that faces the substrate. Accordingly, it shall be assumed that the material removal areas are produced by a removal of material that takes place downward along a direction, i.e. along a material removal direction, that extends substantially perpendicularly to a layer expansion plane formed by a surface of the substrate. The material removal direction thus extends parallel to the growth direction of the layer growth of the multilayer structure. Accordingly, the term "top" is to mean a side or direction that faces away from the substrate.

To be able to achieve an effective optical coupling between the grating structure layer and the laser light of the active region, it has proved particularly advantageous if the top edge of the grating structure layer is at least as high as the bottom edge of the active region. Yet, it may also be advantageous if the grating structure layer also extends above the bottom edge of the active region or maybe even above the top edge of the active region.

According to an advantageous embodiment, it may be provided that the passages are designed to be just deep enough, i.e. that just enough material is removed in the material removal areas, for the active region to be reduced in terms of layer thickness just to a point at which an insulation layer as thin as possible is arranged at least in the material removal areas and a grating structure layer is arranged thereon. Instead of an applied insulation layer, an insulation layer that is formed naturally by oxidation below the grating structure layer is suitable for insulation against the grating structure layer as well. If the etching depth or the material removal in the material removal areas is ideal, the use of such a natural or self-forming insulation layer may be advantageous.

It is particularly advantageous for the spreading of the laser light in the active region if the multilayer structure comprises at least one waveguide layer. It may be particularly advantageous if a first and a second waveguide layer are provided, one waveguide layer being arranged above and one waveguide layer being arranged below the active region. In case that a waveguide layer is arranged above the active region, it exists only in the ridge of the semiconductor laser. This is because the removal of material and the passages between the ridge and the material removal areas at either side of the ridge necessarily spatially limit all layers above the active region in one dimension of the layer expansion plane. This is at least true for all layers that have been applied above the active region prior to the removal of material in the course of the production process.

In other words, this means that a waveguide layer arranged above the active region is spatially limited to the ridge of the semiconductor laser. The same may but must not be true to the same degree for a waveguide layer that is arranged below the active region because the passages between the ridge and the material removal areas extend at least far enough to spatially limit the active region. The layers of the multilayer structure that are arranged below the active region are affected or are not effected by this kind of spatial limitation to the ridge depending on the amount of material removed.

In the embodiment previously described above, in which, however, the passages are just deep enough for the active region to be removed, there is no spatial limitation of a layer, e.g. a waveguide layer, that may be arranged below the active region.

It is further particularly advantageous if the multilayer structure has at least one cladding layer. Said cladding layer can also be arranged above or below the active region, in particular above or below a waveguide layer, in each case facing away from the active region, within the multilayer structure. Regarding the spatial limitation of the cladding layer to the area of the ridge or to the passages and the material removal areas, the relation described above for the waveguide layer applies as a function of the arrangement of the cladding layer above and below the active region. It can be particularly advantageous for the operation of the semiconductor laser if a cladding layer is arranged both above the active region and below the active region.

It has proved particularly desirable both for the operation of the semiconductor laser and for its production if the multilayer structure is configured in such a manner that the order of the layers is mirror-symmetric with respect to the active region.

However, it may further be provided that the multilayer structure has a highly doped top contact layer or cap layer as the topmost layer, by means of which electrical contacting of the semiconductor laser is facilitated. Preferably, the cap layer is adjacent to a cladding layer perpendicularly to the layer expansion plane.

Furthermore, the semiconductor laser can also be designed in such a manner that the passages have an extension in a section, namely an end section, that faces the substrate, said extension being realized in such a manner that the angle between the passage and the layer expansion plane becomes substantially continuously smaller toward the material removal areas adjacent to the passage.

It is further advantageous if the extensions are arranged in the bottom area of the active region and if the bottom edge of the active region is located in the area of the extensions of the passages. According to the generally advantageous arrangement of the grating structure layer, the insulation layer and the grating structure layer may also be arranged in the area of the extensions of the passages. In this context, the arrangement of the grating structure layer and of the insulation layer is to be interpreted in terms of a direction within the layer deposition plane. In other words, it is advantageous if the grating structure layer is arranged at least in the material removal areas and extends into the passages and there in particular into the areas of the extensions. Still, perpendicularly to the layer expansion plane, the grating structure layer and the insulation layer can be designed as described above. The grating structure layer can thus be arranged no more than 100 nm below the active region and its bottom edge. However, the grating structure layer can also be arranged at least at the level of the bottom edge of the active region or above.

Additionally, it is particularly desirable if at least in sections the passages between the ridge and the material removal areas are each formed by a flank. The flanks are produced by the removal of material. Nevertheless, the flanks shall be considered to be a special embodiment of the passages and not be associated with the material removal areas. In other words, the material removal areas are to be defined by their being produced by way of an even removal of material, in particular perpendicular to the layer expansion plane in the removal direction. Accordingly, the above-mentioned extensions are also to be understood as parts of the passages and as sections of the flanks that are also produced by the removal of material but are adjacent only to the material removal areas within the meaning of this description.

It is particularly advantageous for the production of the semiconductor lasers and for the operation of the semiconductor lasers if the flanks are realized as inclined flanks that form, at least in sections, an angle of 10° to 90°, in particular of 70° to 90°, with the layer expansion plane. The angle of the flank can be selected in particular as a function of the active region used in the given case in order to achieve a particularly good effect and a particularly good coupling of the laser light to the feedback element.

Furthermore, it is particularly desirable if the insulation layer and/or the grating structure layer are arranged at least in part in the area of the passages and/or in the area of the flanks and additionally extend substantially parallel to the flanks in particular in the area of the flanks. The case that the insulation layer is also arranged in the area of the flanks can be realized in such a manner, for example, that a method for applying the insulation layer is selected that is not directional, i.e. that has no preferred direction for the application or deposition. Thus, an insulation layer that extends substantially parallel to the flanks is produced in the area of the flanks as well. An insulation layer in the area of the flanks serves to passivate the semiconductor laser in these areas, for example.

If the grating structure layer is arranged at the same time, at least partially in the area of the flanks an in particular substantially parallel to the flanks, it is realized in a particularly advantageous manner that, on the one hand, the grating structure layer is electrically separated from the active region by the insulation layer, thus avoiding an undesired leakage of current through the grating structure layer. On the other hand, an application of the grating structure layer in the area of the flanks as well allows the starting level of the material removal areas, onto which the insulation layer and the grating structure layer are applied, and the exact depth of the material removal in the material removal direction to be largely disregarded while the requirement is met that both along the layer expansion plane and along the material removal direction, the grating structure layer can be arranged closely enough to the active region to permit an optical feedback between the grating structure layer and the laser radiation in the active region.

For an interband cascade laser, the angle between the layer expansion plane and the flank is to be selected as small as possible. Angles of about 70° have proved to be currently practicable and reliable. However, it is also conceivable and desirable to further reduce said angle. In general, a reduction of the angle to about 10° is technically possible as well as desirable.

In contrast, in case the active region comprises a layer structure that serves to form a quantum cascade laser, a passage that is as rectangular as possible is desirable between the ridge and the passages or flanks. In other words, this means that for an active region of this kind, the flank preferably forms an angle of about 90° with the layer expansion plane. Still, in this case, too, slightly smaller angles continue to be more advantageous and are significantly easier to produce and to achieve. Accordingly, angles between 80° and 90° can also be provided for active regions serving to form a quantum cascade laser.

In this regard, it may be provided that the grating structure layer has two separate parallel webs made of metal, in particular chromium, said webs of the grating structure layer being arranged perpendicularly to the orientation of the ridge of the multilayer structure so that an optical feedback with the laser radiation in the active region is produced.

The method according to the invention for producing a semiconductor laser comprises the following method steps, which, however, expressly do not represent the entirety of all method steps.

Instead, the substantial method steps are presented and claimed that serve to achieve the effect according to the invention. A plurality of additional processing steps, as they are known from production methods of generic semiconductor lasers and generic grating structure layers, can purely numerically represent the majority of the total number of method steps for producing the semiconductor laser.

To achieve the idea of the invention, however, it is vital that first a multilayer structure is applied onto a substrate, the layers of the multilayer structure extending parallel to a layer expansion plane defined by a surface of the substrate and the application of the multilayer structure comprising at least the production of an active region comprising a layer structure for forming an interband cascade laser.

In another method step according to the invention, the removal of material of the multilayer structure in at least two separate material removal areas is provided, the material thus being removed substantially perpendicularly to the layer expansion plane and in the material removal direction and a ridge thus being formed in an area in which no material is removed, namely between the material removal areas, said ridge being separated from the material removal areas by passages in such a manner that at least the active region is spatially limited by the passages in one dimension of the layer expansion plane.

At least indirectly subsequently, an insulation layer is applied to at least the material removal areas and a grating structure layer is subsequently applied at least in the area of the material removal areas.

The basic idea according to the invention is realized in the present method inter alia in that the method step of material removal and the method steps of applying the insulation layer and/or the grating structure layer are coordinated in such a manner that the grating structure layer is arranged below, but not more than 100 nm below a bottom edge of the active region.

According to the invention, it is further provided that a metal, in particular chromium, is at least deposited and structured so as to produce the grating structure layer.

This can happen in the course of a sub-method that provides an electron-beam lithography process. In this process, an initially applied resist is exposed, developed and subsequently the metal, in this case chromium, is deposited and subsequently the areas in which the resist was not exposed are removed. Thus, at least in the areas of the grating structure layer that aid coupling with the laser light, separate ridges of the feedback element are produced. For example, they can be arranged perpendicularly to the expansion of the ridge of the multilayer structure. Furthermore, at least in sections, the ridges can exhibit periodicity in the separate areas.

By means of the proposed production method of a semiconductor laser, it is achieved, on the one hand, that current spreading is prevented in the active region, which is made possible by the removal of material, which at least also encompasses the full height of the active region and limits the active region to the ridge. On the other hand, mode selection of the laser radiation by means of a grating structure layer, realized as a DFB structure, for example, is achieved by way of the method according to the invention in such a manner that a higher process tolerance with respect to the arrangement of the grating structure layer is made possible during the method. This, in turn, leads to a higher percent yield of single-mode semiconductor lasers and consequently to lower production costs.

In other words, this means that the three method steps of material removal, application of the insulation layer and application of the grating structure layer can be coordinated with respect to the removal depth and the layer thicknesses of the applied insulation layer and grating structure layer in such a manner that in the end the grating structure layer is arranged no more than 100 nm below the bottom edge of the active region. In summary, this means that the accuracy and the uncertainty in one of the mentioned method steps can be compensated by the two other method steps so that ultimately the relative arrangement of the grating structure layer with respect to the bottom edge of the active region can be achieved.

It is particularly advantageous for the semiconductor laser to be produced if it has at least one waveguide layer and/or one cladding layer above and below the active region, respectively. Accordingly, an advantageous embodiment of the proposed method provides that the production of the multilayer structure, i.e. the application of the multilayer structure, comprises the application of at least one waveguide layer and/or the application of at least one cladding layer.

For example, it may be provided that a waveguide layer is arranged directly above and below the active region and a cladding layer is arranged directly above the top waveguide layer and directly below the bottom waveguide layer. In a preferred embodiment of the method, the removal of material forms extensions in sections facing the substrate, that is in end sections of the passages, the extensions being designed in such a manner that the angle between the passage and the layer expansion plane becomes continuously smaller toward the material removal areas adjacent to the passages.

Additionally, the proposed method can be designed in such a manner that at least in sections, the passages between the ridge and the material removal areas are formed in the shape of flanks by the material removal and that the material is in particular removed in such a manner that the flanks are formed as inclined flanks at least in sections and form an angle of 10° to 90°, in particular between 70° and 90°, with the layer expansion plane of the substrate. As previously explained with reference to the disclosed device, that is the disclosed semiconductor laser, the selection of the angle between a flank for forming a passage between the ridge and a material removal area can depend on the shape and function of the active region, wherein, in particular in case of an active region serving to form an interband cascade layer, smallest possible angles, in particular angles between 10° and 70°, are provided and desired, and in case of an active region that has a layer system of this kind, which allows forming a quantum cascade laser, flanks having a right angle to the layer expansion plane are preferably produced, namely flanks having an angle between about 80° and 90° relative to the layer expansion plane of the substrate.

In another particularly advantageous embodiment of the proposed method, the insulation layer and/or the grating structure layer are arranged during application or the application of the layers is controlled in such a manner that the insulation layer and/or the grating structure layer are arranged at least in part in the area of the passages and/or in the area of the flanks and extend substantially parallel to the flanks in the area of the flanks.

In this way, passivating by means of the insulation layer and an electrical insulation of the passages and of the flanks are achieved.

Moreover, a particularly good and effective coupling can be achieved between the laser radiation in the active region and the grating structure layer.

Figure 1A:
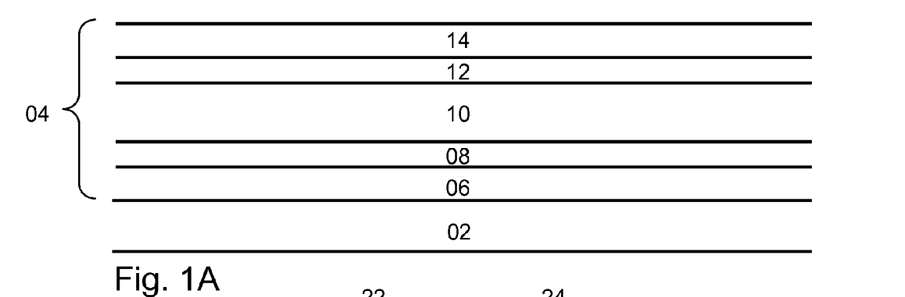
FIGS. 1A to 1C show exemplary stages of the production method of a semiconductor laser according to the invention and a substantially finished semiconductor laser according to the invention.
Figure 1B:
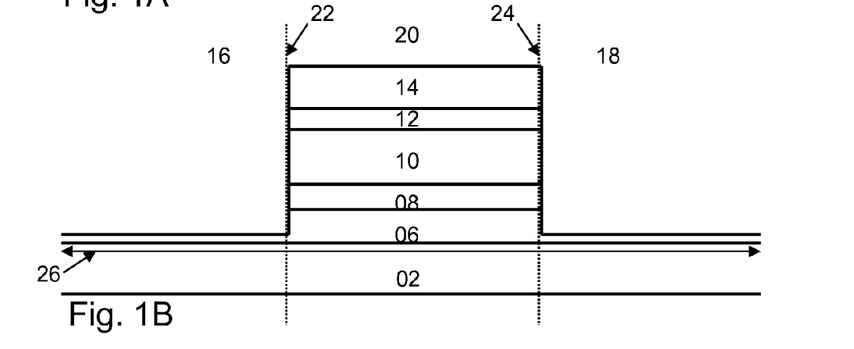
Figure 1C:
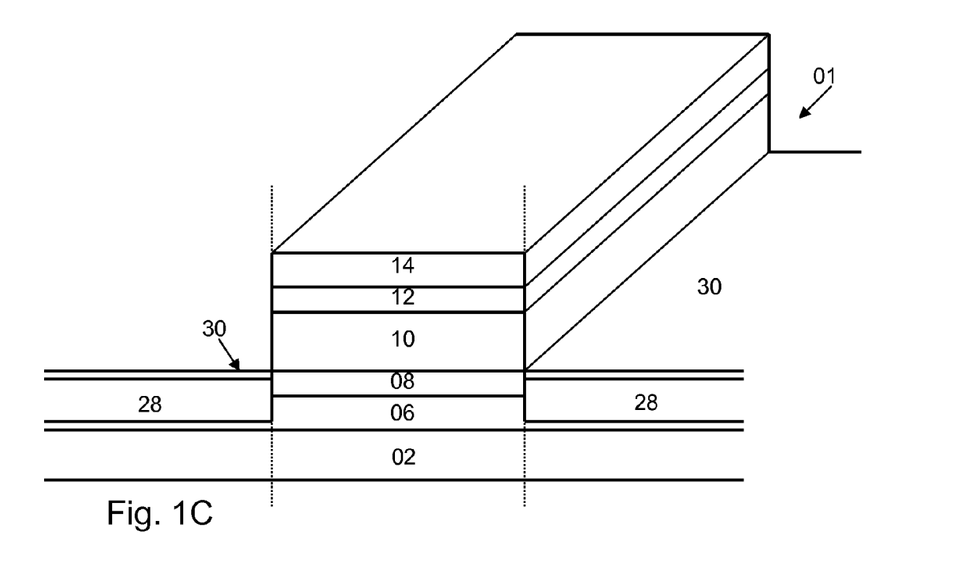
Figure 2:
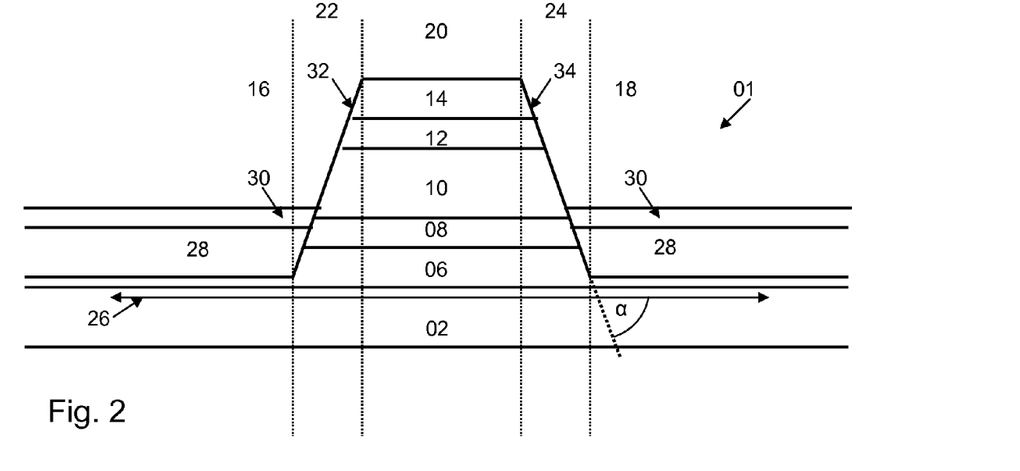
FIG. 2 shows a section through a semiconductor laser according to the invention in a first alternative embodiment.
Figure 3:
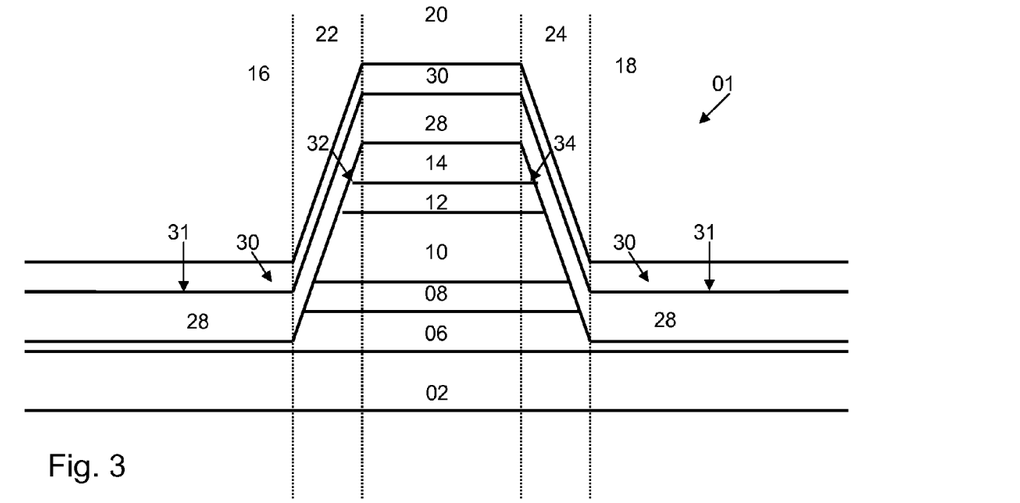
FIG. 3 shows a section through a semiconductor laser according to the invention in a second alternative embodiment.
Figure 4:
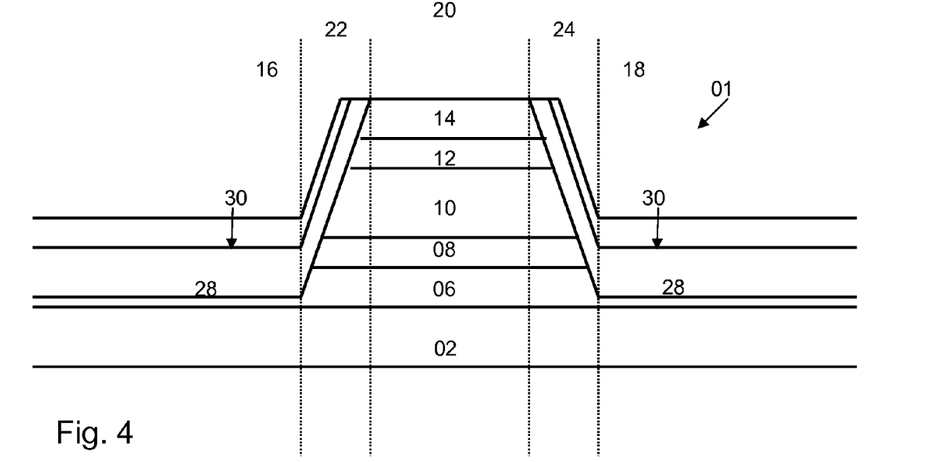
FIG. 4 shows a section through a semiconductor laser according to the invention in a third alternative embodiment.
Figure 5:
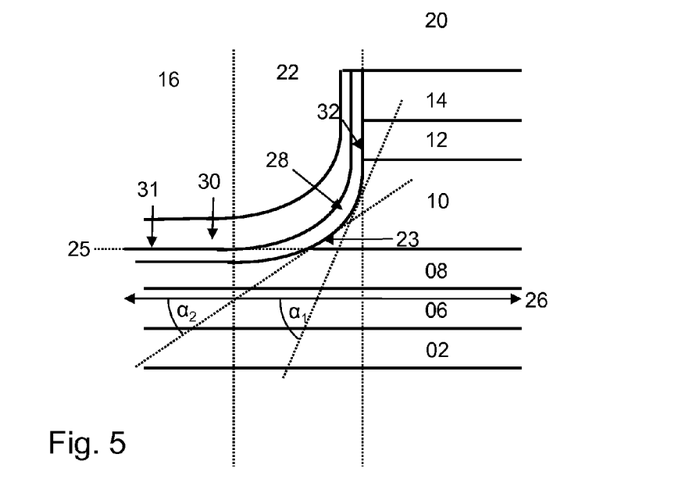
FIG. 5 shows a detail of a section through a semiconductor laser according to the invention in a fourth alternative embodiment.
Figure 6:
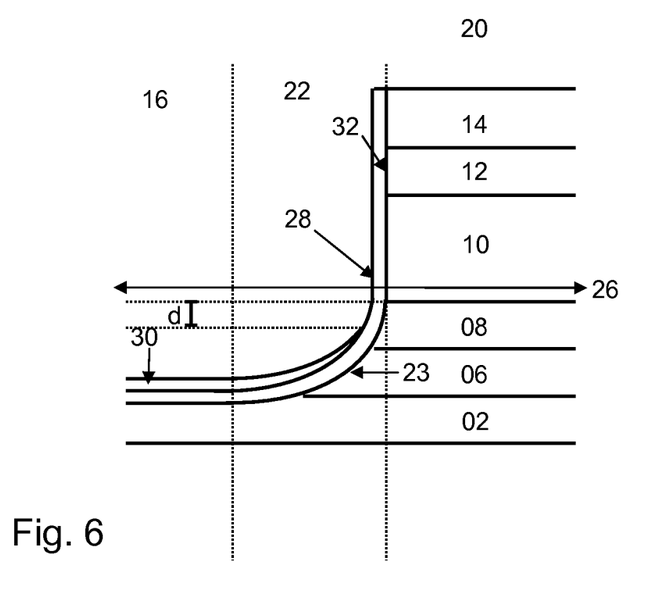
FIG. 6 shows a detail of a section through a semiconductor laser according to the invention in a fifth alternative embodiment.
Figure 7:
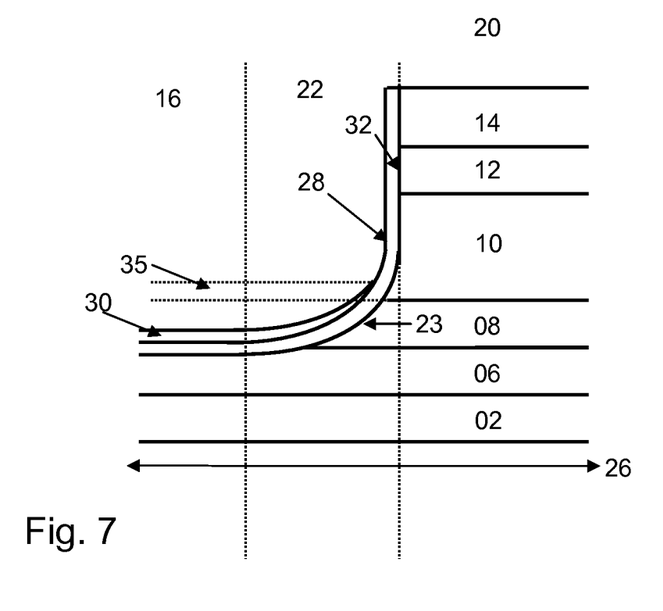
FIG. 7 shows a detail of a section through a semiconductor laser according to the invention in a sixth alternative embodiment.

In the figures:

FIGS. 1A to 1C show exemplary stages of the production method of a semiconductor laser according to the invention and a substantially finished semiconductor laser according to the invention;

FIG. 2 shows a section through a semiconductor laser according to the invention in a first alternative embodiment;

FIG. 3 shows a section through a semiconductor laser according to the invention in a second alternative embodiment;

FIG. 4 shows a section through a semiconductor laser according to the invention in a third alternative embodiment;

FIG. 5 shows a detail of a section through a semiconductor laser according to the invention in a fourth alternative embodiment;

FIG. 6 shows a detail of a section through a semiconductor laser according to the invention in a fifth alternative embodiment;

FIG. 7 shows a detail of a section through a semiconductor laser according to the invention in a sixth alternative embodiment.

FIG. 1A shows a process or method stage during the method according to the invention for producing a semiconductor laser 01 according to the invention. In FIG. 1A, a multilayer structure 04 has previously been applied onto a substrate 02 by means of commonly known method steps, i.e. epitaxial steps. The multilayer structure 04 comprises, in the order of the applied layers and from the bottom to the top, a first cladding layer 06, i.e. a bottom cladding layer 06, a first, i.e. a bottom waveguide layer 08, an active region 10 and a second, i.e. top waveguide layer 12 and finally a second, i.e. top cladding layer 14. The active region 10 can itself be composed of a plurality of individual layers, which can comprise injector layers, for example.

FIG. 1B shows a process or method stage that represents an intermediate product for producing the semiconductor according to the invention after the material has been removed. As can be taken from FIG. 1B, in comparison to FIG. 1A, the previously applied layers have been completely removed in the material removal areas 16, 18 except for the bottom cladding layer 06, and the bottom cladding layer 06 has also been partially removed. In doing so, the ridge 20 is formed between the material removal areas 16 and 18, which is separated from the material removal areas by the passages 22 and 24 in such a manner that the active region 10 is spatially limited in a spatial direction of the layer expansion plane 26 and current spreading within the active region 10 is thus overcome.

In FIG. 1B, the present invention is hereinafter described in such a way that not all layers of the multilayer structure are completely removed in the course of the material removal, but that the respective bottom layer, i.e. the layer adjacent to the substrate, partially remains. However, this happens only for the purposes of illustration, whereas it may also be provided for the implementation of the invention that all layers of the multilayer structure are completely removed by the material removal and that the substrate, that is a substrate surface, is thus exposed after the material removal in the material removal areas 16 and 18. On the other hand, it may also be provided that the material is removed only to a point at which at least the active region 10 is spatially limited and a layer or layers arranged below the active region remain(s) unaffected by the material removal or is/are only partially removed. Also, all figures show a symmetric configuration of the multilayer structure 04 with respect to the active region 10 regarding the order of the layers. This is an advantageous design, while still other layer sequences deviating from said order may be advantageously provided.

FIG. 1C shows a schematic perspective view of a semiconductor laser 01 after completion of the method according to the invention. Compared to the process or method stage of FIG. 1B, an insulation layer 28 and a grating structure layer 30 have been applied or produced at least in the material removal areas 16 and 18 in FIG. 1C. As can be taken from FIG. 1C, the top edge of the grating structure layer 30 is substantially at level with the bottom edge of the active region 10. This enables particularly effective coupling between the laser radiation in the active region 10 and the grating structure layer 30, which correspondingly leads to very exact mode selection of the semiconductor laser 01.

However, as becomes clear from the further description in particular regarding FIG. 2 and FIG. 6, this arrangement of the grating structure layer 30 with respect to the active region 10 of FIG. 1C is not the only possible or appropriate embodiment. In general, the grating structure layer can either be arranged in such a manner that its position relative to the active region allows the grating structure layer 30 and the active region 10 to overlap perpendicularly to the layer expansion plane or that the grating structure layer 30 is at least arranged not more than 100 nm below the active region 10 and its bottom edge.

As can be easily taken from FIG. 1C, the corresponding arrangement of the grating structure layer with respect to the active region can be achieved or produced in a relatively simple manner because it can be brought about by the successive method steps of material removal, application of the insulation layer 28 and subsequent application of the grating structure layer 30. In other words, this means that the layer thickness of the insulation layer 28 or of the grating structure layer 30 can be adjusted depending on how much material has been removed by the material removal, and thus the corresponding or claimed arrangement of the grating structure layer can be easily achieved at least at the level of the bottom edge of the active region 10. Instead of an additionally applying an insulation layer 28, the insulation layer can also be produced by oxidizing the surfaces that have been exposed by means of the material removal. In this context, produced rather means that the insulation layer 28 forms on its own, i.e. naturally, upon contact with oxygen.

FIG. 2 shows a section through a semiconductor laser according to the invention. Apart from the material removal areas 16 and 18 and the ridge 20, FIG. 2 shows two passages 22 and 24 between the ridge and the respective material removal areas 16 and 18, the passages 22 and 24 being formed by the flanks 32 and 34, the flanks 32, 34 each forming an angle of about 80° with the layer expansion plane 26, as indicated in FIG. 2 by the delineation of angle α.

As can also be taken from FIG. 2, the illustrated embodiment of the semiconductor 01, the insulation layer 28 and the structure layer 30 are not exclusively arranged in the area of the material removal areas 16 and 18 but also in the area of the passages 22 and 24, wherein, however, the grating structure layer 30 still extends substantially parallel to the layer expansion plane 26 in the area of the passages 22 and 24. Also illustrated in FIG. 2 is the advantageous embodiment according to which the grating structure layer 30, more precisely its upper edge, is not flush with the bottom edge of the active region 10 but also extends or is arranged above the bottom edge of the active region. Thus, coupling between the laser radiation of the active region 10 and the grating structure layer 30 can be further improved compared to the illustration of FIG. 1C.

FIG. 3 shows a variation of the semiconductor laser 01 compared to FIG. 2, which is different in that the insulation layer 28 is not only arranged in the area of the material removal areas 16 and 18 but also in the entire area of the passages 22 and 24 and in the area of the ridge 20. It may be provided that prior to the application of the insulation layer 28, the method for producing the semiconductor laser 01 first provides a method step by means of which, after the removal of material, another removal of a naturally forming or naturally formed passivating layer or oxide layer is performed on the entire exposed surface and the insulation layer 28 is subsequently applied across the entire surface of all areas. As illustrated in FIG. 3, the grating structure layer 30, too, is provided in the entire area of the passages 22 and 24 and is additionally arranged substantially parallel to the flanks 32 and 34. Even if this means that the grating structure layer is separated from the active region 10 by the insulation layer 28, the design of the semiconductor laser 01 illustrated in FIG. 3 still has the effect that the grating structure 30, which is located with its bottom edge 31 below the bottom edge of the active region 10, extends across the full height of the active region in the direction of the material removal direction and thus particularly effective optical coupling can be achieved between the laser radiation in the active region 10 and the grating structure layer.

From the illustration of FIG. 3, another substantial advantage of the present design becomes clear. By arranging the grating structure layer in the area of the flanks 32, 34, the relative arrangement according to the invention between the grating structure layer 30 and the active region is automatically achieved when a certain material removal depth is reached. In other words, this means that even if a larger amount of material is removed in the material removal areas 16 and 18 and if the material removal areas 16, 18 lie correspondingly deeper, the desired arrangement of the grating structure layer 30 with respect to the active region 10 is inevitably achieved even in the area of the flanks 32, 34 owing to the arrangement of the insulation layer and of the grating structure layer because, due to the parts of the grating structure layer 30 in the area of the flanks 32, 34, the arrangement of the grating structure 30 no more than 100 nm below the active region is always achieved as soon as the depth of the material removal plus the thickness of the insulation layer 28 is at least 100 nm below the bottom edge of the active region. But this precisely means that in case of an arrangement of the grating structure layer 30 in the area of the passages 22, 24 or flanks 32, 34, the removal depth of the material removal areas can be neglected, which allows a significantly simplified production of the semiconductor lasers.

FIG. 4 shows a variation from FIG. 3, in which the applied insulation layer 28 and the grating structure layer 30 have been removed again in the area of the top cladding layer 14 and across the width of the ridge 20. Said removal can be performed in order to expose a highly doped top contact layer or cap layer (not illustrated in FIG. 4) on the cladding layer 14.

FIG. 5 shows a detail of a cross-section through a semiconductor laser 01 according to the invention. The passage 22 in the upper section is realized as a flank 32. In the section of the passage 22 facing the substrate 02, the passage 22 has an extension 23. As indicated by the angles $\alpha_1$ and $\alpha_2$, the angle between the passage and the layer expansion plane 26 becomes continuously smaller toward the material removal area 16 adjacent to the passage. However, continuously is not to be understood in the strictly mathematical sense in this case. In other words, the extension 23 is designed in such a manner that the passage travels through the rounded area into the material removal area 16. The material in FIG. 5 has been removed just deeply enough for the material removal area 16 to be arranged minimally below the bottom edge of the active region. The insulation layer 28 is correspondingly realized in such a manner that the bottom edge 31 of the grating structure layer and the bottom edge of the active region 10 are at the same height, as indicated by the horizontal dotted line 25.

FIG. 5 shows that the insulation layer 28 and the grating structure layer 30 are arranged in the material removal area 16, in the area of the extension 23 of the passage 22 and in the area of the flank 32 of the passage 22.

FIG. 6 shows a variation of FIG. 5. In FIG. 6, too, the passage 22 is formed by a flank 32 in the upper area of the passage 22 and by an extension 23 in a section of the passage 22 facing the substrate. In contrast to FIG. 5, however, more material has been removed in the material removal area 16 in FIG. 6. The grating structure layer 30 is applied on top of the insulation layer 28. Still, the insulation layer 28 is only thick enough for the grating structure layer 30 to be arranged below the bottom edge of the active region 10. The distance between the bottom edge of the active region 10 and the grating structure layer 30 perpendicularly to the layer expansion plane 26 is outlined by distance d. For coupling between the laser radiation in the active region 10 and the grating structure layer 30, it is necessary that distance d is not larger than 100 nm.

In FIG. 7, a design is further illustrated in which a smaller or less deep material removal has taken place in the material removal area 16 as compared to FIG. 6. Correspondingly, the insulation layer 28 and the grating structure layer 30 are arranged higher perpendicularly to the layer expansion plane 26 than in FIG. 6. As indicated by the dotted horizontal lines in FIG. 7, there is an overlap 35 between the bottom edge of the active region 10 and the grating structure layer 30. In other words, this means that the grating structure layer is arranged at level with the bottom edge of the active region 10 and above in the area of the extension 23. This arrangement also allows effective coupling of the laser light in the active region 10 to the grating structure layer 30, leading to effective mode selection.

The invention claimed is:

1. An interband cascade laser, comprising:
a multilayer structure including a ridge and two material removal areas adjacent to the ridge on either side, the multilayer structure being arranged on a substrate and a layer expansion plane being defined by a surface of the substrate, the ridge having at least one active region and at least the active region being spatially limited by passages between the ridge and the material removal areas in one dimension of the layer expansion plane, the active region having a layer structure for forming a laterally-coupled distributed feedback interband cascade laser, wherein at least in the material removal areas, an insulation layer and a superimposed grating structure layer are positioned, the insulation layer and the grating structure layer being arranged in the material removal areas such that the grating structure layer is arranged below, but not more than 100 nm below a bottom edge of the active region, and wherein the grating structure layer comprises a metal.

2. The interband cascade according to claim 1, wherein the multilayer structure has at least one waveguide layer.

3. The interband cascade according to claim 1, wherein the multilayer structure has at least one cladding layer.

4. The interband cascade according to claim 3, wherein perpendicularly to the layer expansion plane, a highly doped upper contact layer is adjacent to a cladding layer.

5. The interband cascade according to claim 1, wherein the passages each have an extension in a section that faces the substrate, the angle between the passage and the layer expansion plane becoming continuously smaller toward the material removal area adjacent to the passage by way of the extensions.

6. The interband cascade according to claim 1, wherein at least in sections, the passages between the ridge and the material removal areas are each formed by a flank.

7. The interband cascade according to claim 6, wherein at least in sections, the flanks are formed by an inclined flank and form an angle of 10°-90° with the layer expansion plane.

8. The interband cascade according to claim 1, wherein one or more of the insulation layer and the grating structure layer are arranged at least in part in one or more of the area of the passages and in the area of the flanks.

9. The interband cascade according to claim 1, wherein the grating structure layer is formed by grating webs that are periodic at least in sections.

10. A method for producing an interband cascade laser comprising the method steps of:
applying a multilayer structure onto a substrate, the layers of the multilayer structure running parallel to a layer expansion plane defined by a surface of the substrate and the application of the multilayer structure including at least the production of an active region having a layer structure for forming a laterally-coupled distributed feedback interband cascade laser;
removing material of the multilayer structure in two separate material removal areas, the material being removed substantially perpendicularly to the layer expansion plane and a ridge thus being formed that is separated from the material removal areas by passages such that at least the active region is spatially limited by the passages in one dimension of the layer expansion plane;
producing an insulation layer at least on the material removal areas; and
applying a grating structure layer at least in the area of the material removal areas, the removal of material and the application of one or more of the insulation layer and of the grating structure layer being coordinated such that the grating structure layer is arranged below, but not more than 100 nm below a bottom edge of the active region, and wherein a metal is at least deposited and structured so as to produce the grating structure layer.

11. The method according to claim 10, wherein the application of the multilayer structure comprises the application of one or more of at least one waveguide layer and at least one cladding layer.

12. The method according to claim 10, wherein by removing the material, an extension is formed in a section of the passages that faces the substrate, the extension being formed such that the angle between the passage and the layer expansion plane becomes continuously smaller toward the material removal area adjacent to the passage.

13. The method according to claim 10, wherein by removing the material, the passages between the ridge and the material removal areas are each formed at least in sections, in the shape of a flank and that the material is removed in such a manner that the flanks are formed at least in sections, as inclined flanks and form an angle of 10°-90° with the layer expansion plane of the substrate.

14. The method according to claim 10, wherein one or more of the insulation layer and the grating structure layer are arranged at least in part in one or more of the area of the passages and in the area of the flanks.

* * * * *